Feb. 13, 1968 M. J. WRIGHT 3,369,172

SWITCHING CIRCUITS

Filed May 14, 1964

3,369,172
SWITCHING CIRCUITS
Maurice James Wright, Birmingham, England, assignor to Joseph Lucas (Industries) Limited, Birmingham, England
Filed May 14, 1964, Ser. No. 367,375
Claims priority, application Great Britain, May 29, 1963, 21,399/63
6 Claims. (Cl. 323—22)

ABSTRACT OF THE DISCLOSURE

A switching circuit includes a gate controlled switch with a load in its anode-cathode circuit, which circuit is connected in use to a D.C. source. An oscillator applies negative pulses to the gate of the switch to turn it off, and the circuit is provided through which positive pulses can be applied to the gate of the switch to turn it on, means being further provided for stopping operation of the oscillator when a pulse is applied to the switch to turn it on.

The object of this invention is to provide a semiconductor switching circuit in a convenient form making use of a semiconductor device which in earlier applications I have termed a switchable rectifier but which now is more generally referred to as a gate-controlled switch. This device is in fact a controlled rectifier which can be switched on and switched off by pulses applied to its gate. A method of manufacturing a gate-controlled switch is described in United States Patent No. 3,223,560.

A switching circuit in accordance with the invention comprises in combination a gate-controlled switch having a load in its anode-cathode circuit, the anode-cathode circuit being connected in use to a D.C. source, an oscillator for applying negative pulses to the gate of said switch to turn it off, a circuit through which positive pulses can be applied to the gate of said switch to turn it on, and means for stopping operation of the oscillator when a pulse is applied to the switch to turn it on.

Figure 1:
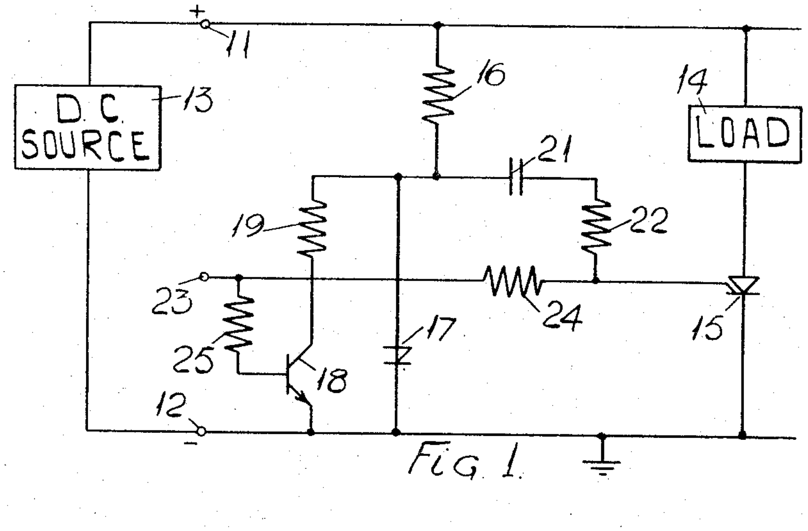
Figure 2:
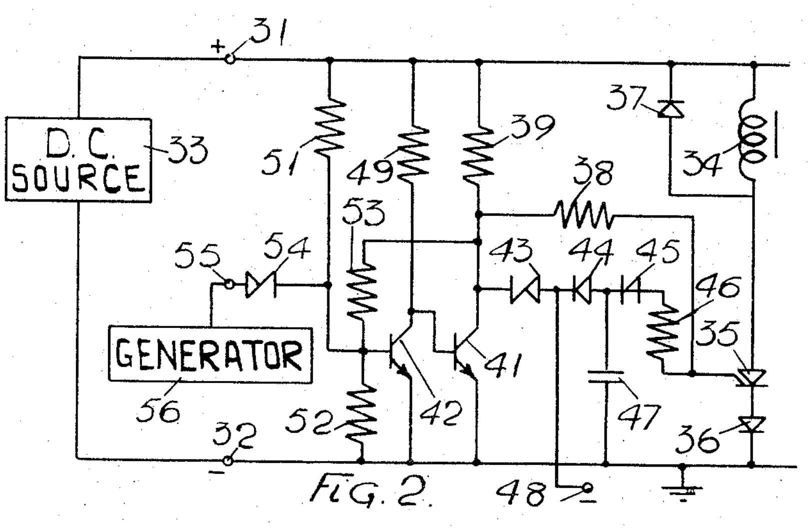

In the accompanying drawings, FIGURES 1 and 2 respectively are circuit diagrams illustrating two examples of the invention.

Referring to FIGURE 1, there are provided terminals 11, 12 which in use are connected to a D.C. source 13 so as to be of positive and negative polarity respectively. The terminal 11 is connected through a load 14 to the anode of a gate-controlled switch 15 the cathode of which is connected to the terminal 12. Moreover, the terminals 11, 12 are interconnected through a resistor 16 and a four-layer diode 17 in series. A point intermediate the resistor 16 and diode 17 is connected to the collector of an n-p-n transistor 18 through a resistor 19 and is also connected to the gate of the switch 15 through a capacitor 21 and resistor 22 in series. The emitter of the transistor 18 is connected to the terminal 12.

There is further provided a third input terminal 23 to which in use positive signals are supplied which will turn on the switch 15. The terminal 23 is connected through a resistor 24 to the gate of the switch 15, and is connected through a resistor 25 to the base of the transistor 18.

In operation, assuming that no signal is present at the terminal 23, the capacitor 21 charges through the resistors 16, 22 and the gate-cathode junction of the switch 15, this charging current being insufficient to turn the switch 15 on. When the voltage across the capacitor reaches the breakdown voltage of the diode 17, this diode breaks down and the capacitor discharges through the diode 17, the resistor 22 and the gate-cathode junction, the pulse of current through the gate-cathode junction being sufficient to turn the switch 15 off if it is conducting. The oscillator constituted by the capacitor 21, diode 17 and associated resistors continues to operate to supply negative pulses to the gate until an input is received at the terminal 23. Any input received at this terminal is of positive polarity and acts through the resistor 24 to turn on the switch 15. At the same time, the transistor 18 is switched on so that the current flowing through the resistor 16 to charge the capacitor 21 is diverted through the resistor 19 and transistor 18 and the oscillator ceases to operate. Thus, the switch 15 remains on until the signal at terminal 23 is removed, at which point the transistor 18 ceases to conduct and the oscillator operates again, the first pulse when the diode 17 breaks down turning off the switch 15.

Referring now to FIGURE 2, there are provided positive and negative terminals 31, 32 connected to a D.C. source 33, the terminal 31 being connected through an energising winding 34 of a D.C. motor to the anode of a gate-controlled switch 35 having its cathode connected to the terminal 32 through the anode and cathode of a diode 36. The winding 34 is bridged by a diode 37, whilst the gate of the switch 35 is connected to the terminal 31 through resistors 38, 39 in series.

A point intermediate the resistors 38, 39 is connected to the collector of an n-p-n transistor 41 having its emitter connected to the terminal 32, its base connected to the collector of an n-p-n transistor 42 and its collector connected to the gate of the switch 35 through a Zener diode 43, a diode 44, a four-layer diode 45 and a resistor 46 in series. A point intermediate the diodes 44, 45 is connected to the terminal 32 through a capacitor 47, whilst a point intermediate the diodes 43, 44 is connected to a terminal 48 to which is supplied a current derived from a source of voltage more negative than the voltage applied to terminal 32.

The transistor 42 has its emitter connected to the terminal 32, its collector connected to the terminal 31 through a resistor 49, and its base connected through resistors 51, 52, 53 respectively to the terminal 31, the terminal 32 and the collector of the transistor 41. Further, the base of the transistor 42 is connected through a Zener diode 54 to a terminal 55 to which is applied the negative output voltage of a generator 56 driven by the motor.

In operation, assuming that the output of the generator 56 is below a predetermined value, the Zener diode 54 is nonconductive and so the transistor 42 is on. The base of transistor 41 is now at substantially the potential of the terminal 32, and so this transistor is off. Current flows through resistors 39 and 38 to the gate of the switch to render it conducting. The potential at the junction of resistors 39 and 38 is at this stage several volts positive with respect to terminal 32, and so the voltage across the Zener diode 43, is sufficient to cause it to conduct. While the Zener diode 43 is conducting, a low impedance path is provided from the terminal 48 through the Zener diode 43 and the resistor 39 to the terminal 31, and so the capacitor 47 is not charged to a sufficiently high voltage to cause the diode 45 to conduct.

If the predetermined value is exceeded, the diode 54 breaks down and the negative output from the generator 56 is applied to the base of the transistor 42 to turn it off. The transistor 41 is now turned on and the potential at the cathode of diode 43 becomes substantially that of terminal 32 so that there is insufficient voltage across the Zener diode 43 to cause it to conduct. As soon as the Zener diode 43 ceases to conduct, current previously flowing through the Zener diode 43 and the resistor 39 flows through the diode 44 to charge the capacitor 47. The voltage across the capacitor 47 now rises until it reaches the break down voltage of the diode 45, at which point the capacitor 47 discharges through the diode 45, the resistor 46, the gate and cathode of the switch 35 and the diode 36. The discharge current of the capacitor 47 turns the gate controlled switch 35 off. Moreover, current previously flowing through resistor 39 is now flowing through transistor 41, so that any current flowing through resistor 38 is insufficient to turn the switch 35 on until the generator output falls below the predetermined value.

Having thus described my invention what I claim as new and desire to secure by Letters Patent is:

1. A semiconductor switching circuit comprising:

(a) a gate controlled switch having an anode, a cathode, and a gate with a load in its anode-cathode circuit, (b) means for connecting said anode-cathode circuit to positive and negative terminals respectively of a D.C. source, (c) means including an oscillator connected for applying negative pulses to said switch gate to turn off said switch, (d) means for applying a positive potential to said switch gate to turn on said switch, and (e) means operable responsive to said positive potential for stopping operation of said oscillator when said positive potential is applied to said switch gate.

2. A semiconductor switching circuit comprising:

(a) a gate-controlled switch having an anode, a cathode, and a gate with a load in its anode-cathode circuit, (b) means for connecting said anode-cathode circuit to positive and negative terminals respectively of a D.C. source, (c) means including an oscillator connected for applying negative pulses to said switch gate to turn off said switch, (d) a terminal to which a positive potential can be applied, (e) means connecting said terminal to said switch gate for turning on said switch on application of said positive potential to said terminal, and (f) means connected to said terminal and operable responsive to said positive potential thereon for preventive operation of said oscillator.

3. A circuit as defined in claim 2 wherein (a) said oscillator includes a capacitor which is alternately charged and discharged, and (b) said oscillator operation preventing means comprises a transistor connected to said terminal and to said capacitor so as to be conductive in response to a positive potential thereon for thereby short-circuiting the charging current of said capacitor.

4. A semiconductor switching circuit comprising:

(a) a gate-controlled switch having an anode, a cathode, and a gate with a load connected in its anode-cathode circuit, (b) means for connecting said anode-cathode circuit to positive and negative terminals respectively of a D.C. source, (c) means including an oscillator having a capacitor connected for applying negative pulses to said switch gate to turn off said switch, (d) a circuit for applying a positive potential to said gate to turn on said switch, (e) means rendering said oscillator inoperative in response to said positive potential on said gate circuit, and (f) means for bypassing said positive potential from said gate and concurrently restoring said oscillator to operative condition.

5. A circuit as defined in claim 4 wherein (a) a Zener diode and a transistor are connected to be respectively conductive and nonconductive on the application of said positive potential to said switch gate, said Zener diode being connected to short-circuit said oscillator capacitor when thus conductive and said transistor being connected so as to be rendered conductive for bypassing said positive potential from said gate and concurrently renders the Zener diode nonconductive and restores said oscillator to operative condition.

6. A circuit as claimed in claim 1 in which the load is the energising winding of a D.C. motor driving a generator, the output of which is used to provide signals to ensure that the oscillator turns off the switch only when the generator output is above a predetermined value.

References Cited

UNITED STATES PATENTS

| | | | |
|---|---|---|---|
| 3,299,303 | 1/1967 | Newill et al. | 322—28 X |
| 3,303,389 | 2/1967 | Jones et al. | 317—33 |
| 3,200,304 | 8/1965 | Atkins et al. | |
| 3,151,288 | 9/1964 | Avizienis et al. | 322—28 |
| 3,192,462 | 6/1965 | James | 318—345 |
| 3,223,852 | 12/1965 | Wright | 307—88.5 |
| 3,271,700 | 9/1966 | Gutzwiller | 333—111 X |

MILTON O. HIRSHFIELD, *Primary Examiner.*

R. V. LUPO, *Assistant Examiner.*